(12) United States Patent
Liao et al.

(10) Patent No.: US 11,502,083 B2
(45) Date of Patent: Nov. 15, 2022

(54) HAFNIUM OXIDE-BASED FERROELECTRIC FIELD EFFECT TRANSISTOR AND MANUFACTURING METHOD THEREOF

(71) Applicant: XIANGTAN UNIVERSITY, Xiangtan (CN)

(72) Inventors: Min Liao, Xiangtan (CN); Binjian Zeng, Xiangtan (CN); Yichun Zhou, Xiangtan (CN); Jiajia Liao, Xiangtan (CN); Qiangxiang Peng, Xiangtan (CN); Yanwei Huan, Xiangtan (CN)

(73) Assignee: XIANGTAN UNIVERSITY, Xiangtan (CN)

( * ) Notice: Subject to any disclaimer, the term of this patent is extended or adjusted under 35 U.S.C. 154(b) by 0 days.

(21) Appl. No.: 17/485,417

(22) Filed: Sep. 25, 2021

(65) Prior Publication Data
US 2022/0020747 A1 Jan. 20, 2022

Related U.S. Application Data

(63) Continuation of application No. PCT/CN2019/080759, filed on Apr. 1, 2019.

(30) Foreign Application Priority Data

Mar. 26, 2019 (CN) .......................... 201910233623.6

(51) Int. Cl.
*H01L 27/105* (2006.01)
*H01L 29/78* (2006.01)
(Continued)

(52) U.S. Cl.
CPC .... *H01L 27/1052* (2013.01); *H01L 29/40111* (2019.08); *H01L 29/40114* (2019.08);
(Continued)

(58) Field of Classification Search
CPC ........... H01L 29/6684; H01L 29/78391; H01L 29/516; G11C 11/22
See application file for complete search history.

(56) References Cited

U.S. PATENT DOCUMENTS

| 8,339,859 B2 | 12/2012 | Park et al. |
| 9,780,297 B2 | 10/2017 | Lee et al. |

(Continued)

FOREIGN PATENT DOCUMENTS

| CN | 1479356 A | 3/2004 |
| CN | 1790718 A | 6/2006 |

(Continued)

OTHER PUBLICATIONS

English translation of CN108321197 (Year: 2018).*
Internation Search Report of PCT/CN2019/080759, dated Dec. 25, 2019.

*Primary Examiner* — Xiaoming Liu
(74) *Attorney, Agent, or Firm* — True Shepherd LLC; Andrew C. Cheng

(57) ABSTRACT

A hafnium oxide-based ferroelectric field effect transistor includes a substrate, an isolation region arranged around the substrate; a gate structure including a buffer layer, a floating gate electrode, a hafnium oxide-based ferroelectric film layer, a control gate electrode and a film electrode layer which are sequentially stacked from bottom to top at a middle part of an upper surface of the substrate, a side wall arranged outside the gate structure, a source region and a drain region arranged oppositely at two sides of the gate structure and are formed by extending from an inner side of the isolation region to the middle part of the substrate, a first metal silicide layer formed by extending from the inner side of the isolation region to the side wall, and a second metal silicide layer arranged on an upper surface of the gate structure.

5 Claims, 4 Drawing Sheets

(51) Int. Cl.
*H01L 29/788* (2006.01)
*H01L 21/28* (2006.01)
*H01L 29/66* (2006.01)

(52) U.S. Cl.
CPC .... *H01L 29/6684* (2013.01); *H01L 29/66492* (2013.01); *H01L 29/66825* (2013.01); *H01L 29/7833* (2013.01); *H01L 29/7887* (2013.01); *H01L 29/78391* (2014.09)

(56) References Cited

U.S. PATENT DOCUMENTS

| | | |
|---|---|---|
| 2005/0054166 A1 | 3/2005 | Hsu et al. |
| 2005/0157549 A1 | 7/2005 | Mokhlesi et al. |
| 2019/0207009 A1* | 7/2019 | Yamaguchi ......... H01L 29/6684 |
| 2019/0304987 A1* | 10/2019 | Dong .................... H01L 29/788 |

FOREIGN PATENT DOCUMENTS

| | | | |
|---|---|---|---|
| CN | 108321197 A | * | 7/2018 |
| CN | 108321197 A | | 7/2018 |
| CN | 108493101 A | | 9/2018 |

* cited by examiner

HAFNIUM OXIDE-BASED FERROELECTRIC FIELD EFFECT TRANSISTOR AND MANUFACTURING METHOD THEREOF

CROSS REFERENCE TO RELATED APPLICATIONS

This application is a continuation of International Patent Application No. PCT/CN2019/080759 with a filing date of Apr. 1, 2019, designating the United States, now pending, and further claims priority to Chinese Patent Application No. 201910233623.6 with a filing date of Mar. 26, 2019. The content of the aforementioned applications, including any intervening amendments thereto, are incorporated herein by reference.

TECHNICAL FIELD

The present disclosure relates to the technical field of electronics, in particular to a hafnium oxide-based ferroelectric field effect transistor and a manufacturing method thereof.

BACKGROUND

With continuous development of information technologies, it is increasingly difficult for the existing computer memory architecture and mainstream memories such as DRAM and FLASH to meet the requirements of high-speed computation and low power consumption, and it has become an inevitable trend to develop new memory technologies. International Roadmap for Devices and Systems (IRDS) published in 2016 states that a Ferroelectric Field Effect Transistor (FeFET) memory is one of the most promising new memory technologies at present, which has the advantages of high access speed, low power consumption, non-volatility, simple structure, etc. The FeFET is similar to a conventional metal-oxide-semiconductor field effect transistor (MOSFET) in structure, and uses a ferroelectric film material instead of a gate oxide dielectric layer as a memory medium. At present, FeFET memories mainly include two types of structures. One is a floating gate FeFET of which a gate structure is Metal electrode (M)/Ferroelectric film (F)/Metal electrode (M)/Insulator (I)/Semiconductor (S), namely MFMIS; and the other one is an MFIS-FET of which the gate structure is metal electrode (M)/Ferroelectric film (F)/Insulator (I)/Semiconductor (S), namely MFIS. Compared with an MFIS-FET memory, an MFMIS-FET memory has the better retention characteristic, and can increase the memory windows, lower an erasing voltage and improve the fatigue performance by adjusting the area ratio of a floating gate and a control gate.

There are mainly three types of floating gate type ferroelectric field effect transistors as follows in the prior art, but these three types of ferroelectric field effect transistors have the following shortcomings respectively:

1. The first type is an MFMIS-FET with a gate structure of Pt/SrBi$_2$Ta$_2$O$_9$/Pt/SrTa$_2$O$_6$/SiON/Si; by designing the area ratio of the control gate and floating gate, the SrBi$_2$Ta$_2$O$_9$ ferroelectric film can be in a saturation polarization state at a lower operation voltage, thus realizing a larger memory window and better retention characteristic. However, SrBi$_2$Ta$_2$O$_9$ ferroelectric thin film has poor scalability with a thickness generally greater than 200 nm. In addition, the inert metal Pt is difficult to be etched, which limits the scaling processes of the MFMIS-FET based on a Pt/SrBi$_2$Ta$_2$O$_9$/Pt/SrTa$_2$O$_6$/SiON/Si structure.

2. The second type is an n type MFPIS-FET based on Pt/Pb(Zr$_{0.52}$Ti$_{0.48}$)O$_3$/Poly-Si/SiO$_2$/Si. In this structure, poly-Si is used as a floating gate, so a simpler process is achieved, and components of Pb(Zr$_{0.52}$Ti$_{0.48}$)O$_3$ can be prevented from being diffused toward a substrate, which is more conducive to integration of a ferroelectric process and a semiconductor process. However, a Pb(Zr$_{0.52}$Ti$_{0.48}$)O$_3$ film is also poor in scalability and has a thickness generally greater than 70 nm. In addition, Pb is a volatile element, which also increases the difficulty of integration process. The inert Pt is still used as a top-contact electrode, which limits the scaling processes.

3. The third type is a hafnium oxide-based ferroelectric film MFMIS gate structure, which has the following disadvantages: a floating gate (bottom-contact electrode) and a control gate (top-contact electrode) of the gate structure are both TaN electrodes. However, a TaN electrode is likely to react with a hafnium oxide-based ferroelectric film to form an interface layer during an annealing process, and metal elements may be diffused. As a result, an electrical performance of a device is degraded; and the electrical performance of the device is degraded more obviously when a size of the device is further reduced.

SUMMARY

I. Purpose of the Present Disclosure

The purpose of the present disclosure is to provide a hafnium oxide-based ferroelectric field effect transistor and a manufacturing method thereof to solve the problems about reliability, technical deficiencies and the like in an existing floating gate type ferroelectric field effect transistor technology, so as to realize high-reliability integration of this device.

II. Technical Solutions

In order to solve the above problems, a first aspect of the present disclosure provides a hafnium oxide-based ferroelectric field effect transistor, which includes a substrate, an isolation region, a gate structure, side walls, a source region, a drain region, a first metal silicide layer and a second metal silicide layer, where the isolation region is arranged around the substrate; an upper surface of the isolation region is not lower than that of the substrate, and a bottom surface of the isolation region is not lower than that of the substrate; the gate structure includes a buffer layer, a floating gate electrode, a hafnium oxide-based ferroelectric film layer, a control gate electrode and a film electrode layer which are sequentially stacked from bottom to top at a middle part of the upper surface of the substrate; the side walls are arranged outside the gate structure, and inner surfaces of the side walls are closely attached to the gate structure; the source region and the drain region are arranged oppositely at two sides of the gate structure and are formed by extending from an inner side of the isolation region to the middle part of the substrate; upper surfaces of the source region and the drain region are flush with the substrate, and bottom surfaces of the source region and the drain region are not lower than that of the isolation region; the first metal silicide layer is formed by extending from the inner side of the isolation region to the side walls; an upper surface of the first metal silicide layer is higher than that of the substrate; a bottom surface of the first metal silicide layer is higher than that of the isolation region; the first metal silicide layer is shorter than the source region or drain region; the second metal silicide layer is arranged on an upper surface of the gate structure; a lower surface of the second metal silicide layer is closely attached to the gate structure; and the floating gate electrode and the control gate electrode are made from HfNx, where 0<x≤1.1.

Further, the buffer layer is made from any one or more of $SiO_2$, SiON, $Al_2O_3$, $La_2O_3$, $HfO_2$, HfON, HfSiON, and aluminum-doped $HfO_2$ ($Al:HfO_2$).

Further, the buffer layer has a thickness of 3 nm to 10 nm.

Further, each of the floating gate electrode and the control gate electrode has a thickness of 5 nm to 50 nm.

Further, the film electrode layer is made from any one or more of polysilicon, amorphous silicon, W, TaN, TiN and $HfN_x$ (0<x≤1.1).

Further, the film electrode layer has a thickness of 10 nm to 200 nm.

Further, the first metal silicide layer and the second metal silicide layer are made from any one of $TiSi_2$, $CoSi_2$ and $NiSi_2$.

Further, each of the first metal silicide layer and the second metal silicide layer has a thickness of 5 nm to 30 nm.

Further, at least one element from the group consisting of zirconium (Zr), aluminum (Al), silicon (Si), yttrium (Y), strontium (Sr), lanthanum (La), lutetium (Lu), gadolinium (Gd), scandium (Sc), neodymium (Nd), germanium (Ge) and nitrogen (N) is doped in the hafnium oxide-based ferroelectric film layer, and further preferably, at least one element from the group consisting of zirconium (Zr), aluminum (Al), silicon (Si) and lanthanum (La) is doped in the hafnium oxide-based ferroelectric film layer.

Further, the hafnium oxide-based ferroelectric film layer has a thickness of 3 nm to 20 nm.

A second aspect of the present disclosure provides a manufacturing method of the above hafnium oxide-based ferroelectric field effect transistor, which includes the steps of:

S1, cleaning a substrate;

S2, arranging an isolation region around the substrate, where an upper surface of the isolation region is not lower than that of the substrate, and a bottom surface of the isolation region is not lower than that of the substrate;

S3, forming a multilayer film structure on the substrate;

S4, etching the multilayer film structure formed in the S3 to form a gate structure;

S5, respectively forming a first lightly doped region and a second lightly doped region on the substrate and on two sides of the gate structure by adopting a lightly doped drain process;

S6, forming side walls on the two sides of the gate structure, where inner surfaces of the side walls are closely attached to the gate structure;

S7, respectively forming a first heavily doped region and a second heavily doped region in the first lightly doped region and the second lightly doped region on the two sides of the side walls;

S8, depositing electrode metal on a device structure formed in the S7;

S9, performing rapid thermal annealing on a device structure formed in the S8 to activate ions implanted in the steps S5 and S7 to form a source region and a drain region, forming a first metal silicide layer on the source region and the drain region, and forming a second metal silicide layer on an upper surface of the gate structure; and S10, etching the electrode metal which is deposited in the S8 and unreacted during annealing in the S9 to obtain the hafnium oxide-based ferroelectric field effect transistor.

Further, the operation of forming the multilayer film structure in the S3 includes the following steps of:

S31, forming a buffer layer on an upper surface of the substrate, preferably by an atomic layer deposition process, a chemical vapor deposition process, a chemical oxidation process or a thermal oxidation process;

S32, forming a floating gate electrode on an upper surface of the buffer layer, preferably by an atomic layer deposition process, a chemical vapor deposition process or a magnetron sputtering process;

S33, forming a doped hafnium oxide film layer on an upper surface of the floating gate electrode, preferably by an atomic layer deposition process, a metal-organic chemical vapor deposition process or a magnetron sputtering process;

S34, forming a control gate electrode on an upper surface of the doped hafnium oxide film layer, preferably by a magnetron sputtering process, a chemical vapor deposition process or an atomic layer deposition process; and S35, forming a film electrode layer on an upper surface of the control gate electrode, preferably by a magnetron sputtering process or a chemical vapor deposition process.

Further, the etching process in the S4 is a reactive ion etching process.

Further, the operation in the S7 includes: respectively forming the first heavily doped region and the second heavily doped region in the first lightly doped region and the second lightly doped region on the two sides of the side walls by an iron implantation process.

Further, in the S8, the electrode metal is deposited by a magnetron sputtering process or a chemical vapor deposition process.

Further, the rapid thermal annealing operation in the S9 further includes:

forming a ferroelectric phase in the doped hafnium oxide-based film layer to form a doped hafnium oxide-based ferroelectric film layer.

Further, the rapid thermal annealing operation in the S9 is performed at a temperature of 400° C. to 1000° C. for 1-60 seconds; and/or the rapid thermal annealing operation is performed in vacuum or in an inert gas; and preferably, the inert gas is $N_2$ or Ar.

Further, the etching process in the S10 is a wet etching process.

III. Beneficial Effects

The technical solutions of the present disclosure have the following beneficial technical effects:

1. HfNx (0<x≤1.1) with an excellent thermal stability is used as the floating gate electrode and the control gate electrode; and as an Hf series metal, HfNx (0<x≤1.1) commendably solves the problem about interface reaction between the floating gate electrode and the control gate electrode and a hafnium oxide-based ferroelectric film during a crystallization annealing process in the prior art, avoids elements diffusions, and improves electrical reliability of a hafnium oxide-based ferroelectric field effect transistor.

2. The manufacturing method of a hafnium oxide-based ferroelectric field effect transistor provided by the present disclosure adopts a gate-first process, which can achieve a high integration density; moreover, a self-alignment process is introduced, that is, a gate structure formed after etching is used as a mask, and lightly doped regions are formed on two sides of the gate structure by an ion implantation process, which can lower the process difficulty.

3. By adopting an RTA technology, operations of the process are simplified; on the one hand, implanted ions are activated to form the source region and the drain region of the hafnium oxide-based ferroelectric field effect transistor; on the other hand, the doped hafnium oxide film layer is crystallized to form a ferroelectric phase, i. e., a hafnium oxide-based ferroelectric film is formed; and metal silicide layers can also be formed on the source region, the drain region and the gate structure to lower a contact resistance.

REFERENCE NUMERALS

1: substrate; 2: isolation region; 3: gate structure; 31: buffer layer; 32: floating gate electrode; 33a: doped hafnium oxide film layer; 33b: hafnium oxide-based ferroelectric film layer (formed by annealing 32a); 34: control gate electrode; 35: film electrode layer; 4: side wall; 5: source region; 51a: first lightly doped region; 52a: first heavily doped region; 51b: activated first lightly doped region (formed by annealing 51a); 52b: activated first heavily doped region (formed by annealing 52a); 6: drain region; 61a: second lightly doped region; 62a: second heavily doped region; 61b: activated second lightly doped region (formed after annealing at 61a); 62b: activated second heavily doped region (formed after annealing at 62a); 71: first metal silicide layer; and 72: second metal silicide layer.

DETAILED DESCRIPTION OF THE EMBODIMENTS

To make the purpose, technical solutions, and advantages of the present disclosure clearer, the present disclosure is further described in detail with reference to specific embodiments and the accompanying drawings. It should be understood that these descriptions are merely exemplary and are not intended to limit the scope of the present disclosure. In addition, in the following description, descriptions of conventional structures and technologies are omitted to avoid unnecessarily confusing the concepts of the present disclosure.

It should be noted that the terms "first" and "second" in the description of the present disclosure are merely used for description purpose and cannot be understood to indicate or imply relative importance.

Figure 1:
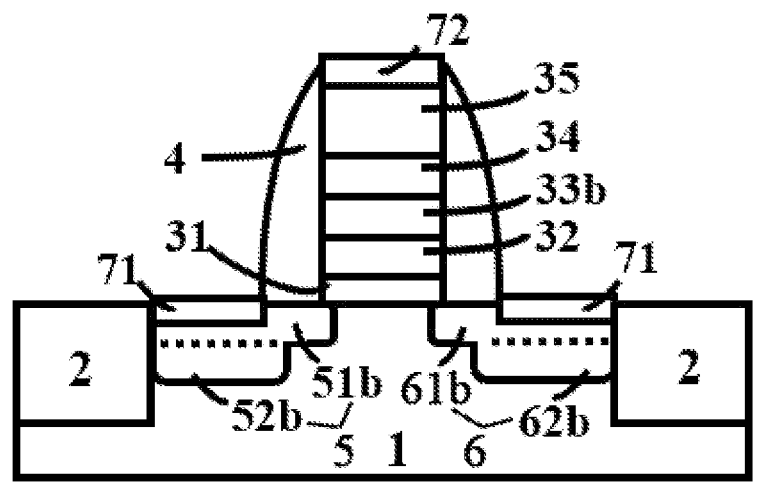
FIG. 1 is a structural schematic diagram of a hafnium oxide-based ferroelectric field effect transistor provided by an embodiment of the present disclosure.

FIG. 1 is a structural schematic diagram of a hafnium oxide-based ferroelectric field effect transistor provided by an embodiment of the present disclosure.

Referring to FIG. 1, an embodiment of the present disclosure provides a hafnium oxide-based ferroelectric field effect transistor, which includes a substrate 1, an isolation region 2, a gate structure 3, side walls 4, a source region 5, a drain region 6, a first metal silicide layer 71 and a second metal silicide layer 72.

Optionally, the substrate 1 is p-type or n-type doped monocrystalline silicon or silicon-on-insulator (SOI for short).

Preferably, an element boron (B) is doped in p-type doping, and an element phosphorus (P) or arsenic (As) is doped in n-type doping.

The isolation region 2 is arranged around the substrate 1; an upper surface of the isolation region 2 is not lower than that of the substrate 1; and a bottom surface of the isolation region 2 is not lower than that of the substrate 1.

Optionally, the isolation region 2 is made from at least one of $SiO_2$ and $Si_3N_4$.

The gate structure 3 includes a buffer layer 31, a floating gate electrode 32, a hafnium oxide-based ferroelectric film layer 33b, a control gate electrode 34 and a film electrode layer 35 which are sequentially stacked from bottom to top at a middle part of the upper surface of the substrate 1.

Optionally, the buffer layer 31 is made from any one or more of $SiO_2$, SiON, $Al_2O_3$, $La_2O_3$, $HfO_2$, HfON, HfSiON, and aluminum-doped $HfO_2$($Al:HfO_2$).

Optionally, the buffer layer 31 has a thickness of 3 nm to 10 nm.

Optionally, at least one element from the group consisting of zirconium (Zr), aluminum (Al), silicon (Si), yttrium (Y), strontium (Sr), lanthanum (La), lutetium (Lu), gadolinium (Gd), scandium (Sc), neodymium (Nd), germanium (Ge) and nitrogen (N) is doped in the hafnium oxide-based ferroelectric film layer 33b.

Preferably, at least one element from the group consisting of zirconium (Zr), aluminum (Al), silicon (Si) and lanthanum (La) is doped in the hafnium oxide-based ferroelectric film layer 33b.

Optionally, the hafnium oxide-based ferroelectric film layer 33b has a thickness of 3 nm to 20 nm.

Optionally, the floating gate electrode 32 and the control gate electrode 34 are made from HfNx, and the HfNx includes x N atoms, where $0<x\leq1.1$.

Optionally, each of the floating gate electrode 32 and the control gate electrode 34 has a thickness of 5 nm to 50 nm.

Optionally, the film electrode layer 35 is made from any one or more of polysilicon, amorphous silicon, W, TaN, TiN and $HfN_x(0<x\leq1.1)$.

Optionally, the film electrode layer 35 has a thickness of 10 nm to 200 nm.

The side walls 4 are arranged outside the gate structure 3, and inner surfaces of the side walls 4 are closely attached to the gate structure 3.

The source region 5 and the drain region 6 are oppositely arranged on two sides of the gate structure 3, and are formed by extending from an inner side of the isolation region 2 to the middle part of the substrate 1; the upper surfaces of the source region 5 and the drain region 6 are flush with the substrate 1; and the bottom surfaces of the region 5 and the drain region 6 are not lower than that of the isolation region 2.

The first metal silicide layer 71 extends from the inner side of the isolation region 2 to the side walls 4; the upper surface of the first metal silicide layer 71 is higher than that of the substrate 1; the bottom surface of the first metal silicide layer 71 is higher than that of the isolation region 2; and the first metal silicide layer 71 is shorter than the source region 5 or the drain region 6. A length of the first metal silicide layer 71 refers to a dimension in an extension direction from the inner side of the isolation region 2 to the side walls 4, that is, the dimension in the left-right direction in FIG. 1; and a length of the source region 5 (or the drain region 6) refers to a dimension in an extension direction from the inner side of the isolation region 2 to the middle part of the substrate 1.

The second metal silicide layer 72 is arranged on an upper surface of the gate structure 3, and a lower surface of the second metal silicide layer 72 is closely attached to the gate structure 3.

Optionally, the first metal silicide layer 71 and the second metal silicide layer 72 are made from any one of $TiSi_2$, $CoSi_2$ and $NiSi_2$.

Optionally, each of the first metal silicide layer 71 and the second metal silicide layer 72 has a thickness of 5 nm to 30 nm.

In the above embodiment, when the substrate 1 is made from a p-type doped material, the source region 5 and the drain region 6 are made from n-type doped monocrystalline silicon or silicon-on-insulator; or when the substrate 1 is made from an n-type doped material, the source region 5 and the drain region 6 are made from p-type doped monocrystalline silicon or silicon-on-insulator.

In a specific embodiment of the present disclosure, the hafnium oxide-based ferroelectric field effect transistor includes a substrate 1, an isolation region 2, a gate structure 3, side walls 4, a source region 5, a drain region 6, a first metal silicide layer 71 and a second metal silicide layer 72.

The substrate 1 is p-type doped monocrystalline silicon, and an element boron (P) is doped in p-type doping.

The isolation region 2 is arranged around the substrate 1; an upper surface of the isolation region 2 is not lower than that of the substrate 1; and a bottom surface of the isolation region 2 is not lower than that of the substrate 1, wherein the isolation region 2 is made from $SiO_2$.

The gate structure 3 includes a buffer layer 31, a floating gate electrode 32, a hafnium oxide-based ferroelectric film layer 33b, a control gate electrode 34 and a film electrode layer 35 which are sequentially stacked from bottom to top at a middle part of the upper surface of the substrate 1, where the buffer layer 31 is made from $HfO_2$ and has a thickness of 5 nm; an element zirconium (Zr) is doped in the hafnium oxide-based ferroelectric film layer 33b, with a doping amount of 50% and a thickness of 10 nm; the floating gate electrode 32 and the control gate electrode 34 are made from HfN with a thickness of 10 nm; and the film electrode layer 35 is made from polysilicon and has a thickness of 50 nm.

The side walls 4 are arranged outside the gate structure 3; inner surfaces of the side walls 4 are closely attached to the gate structure 3; the side walls 4 are made from $SiO_2$; and a transverse width of the gate structure 3 is equal to a distance between the two side walls 4.

The source region 5 and the drain region 6 are oppositely arranged on two sides of the gate structure 3, and are formed by extending from an inner side of the isolation region 2 to the middle part of the substrate 1; the upper surfaces of the source region 5 and the drain region 6 are flush with the substrate 1; the bottom surfaces of the region 5 and the drain region 6 are higher than that of the isolation region 2; and an element phosphorus is doped in the source region 5 and the drain region 6.

Specifically, the source region 5 includes an activated first lightly doped region 51b and an activated first heavily doped region 52b, and the drain region 6 includes an activated second lightly doped region 61b and an activated second heavily doped region 62b. The activated first lightly doped region 51b and the activated second lightly doped region 61b are each formed by annealing a lightly doped region, while the activated first heavily doped region 52b and the activated second heavily doped region 62b are each formed by annealing a heavily doped region.

The first metal silicide layer 71 extends from the inner side of the isolation region 2 to the side walls 4; the upper surface of the first metal silicide layer 71 is higher than that of the substrate 1; the bottom surface of the first metal silicide layer 71 is higher than that of the isolation region 2; the first metal silicide layer 71 is shorter than the source region 5 or the drain region 6; and the first metal silicide layer 71 is made from TiSi2 and has a thickness of 10 nm.

The second metal silicide layer 72 is arranged on the upper surface of the gate structure 3; the lower surface of the second metal silicide layer 72 is closely attached to the gate structure 3; and the second metal silicide layer 72 is made from $TiSi_2$ and has a thickness of 10 nm.

In this embodiment, positions of the source region 5 and the drain region 6 shown in FIG. 1 are merely examples and are not intended to limit the present disclosure; and the positions of the source region 5 and the drain region 6 can be exchanged.

Figure 2:
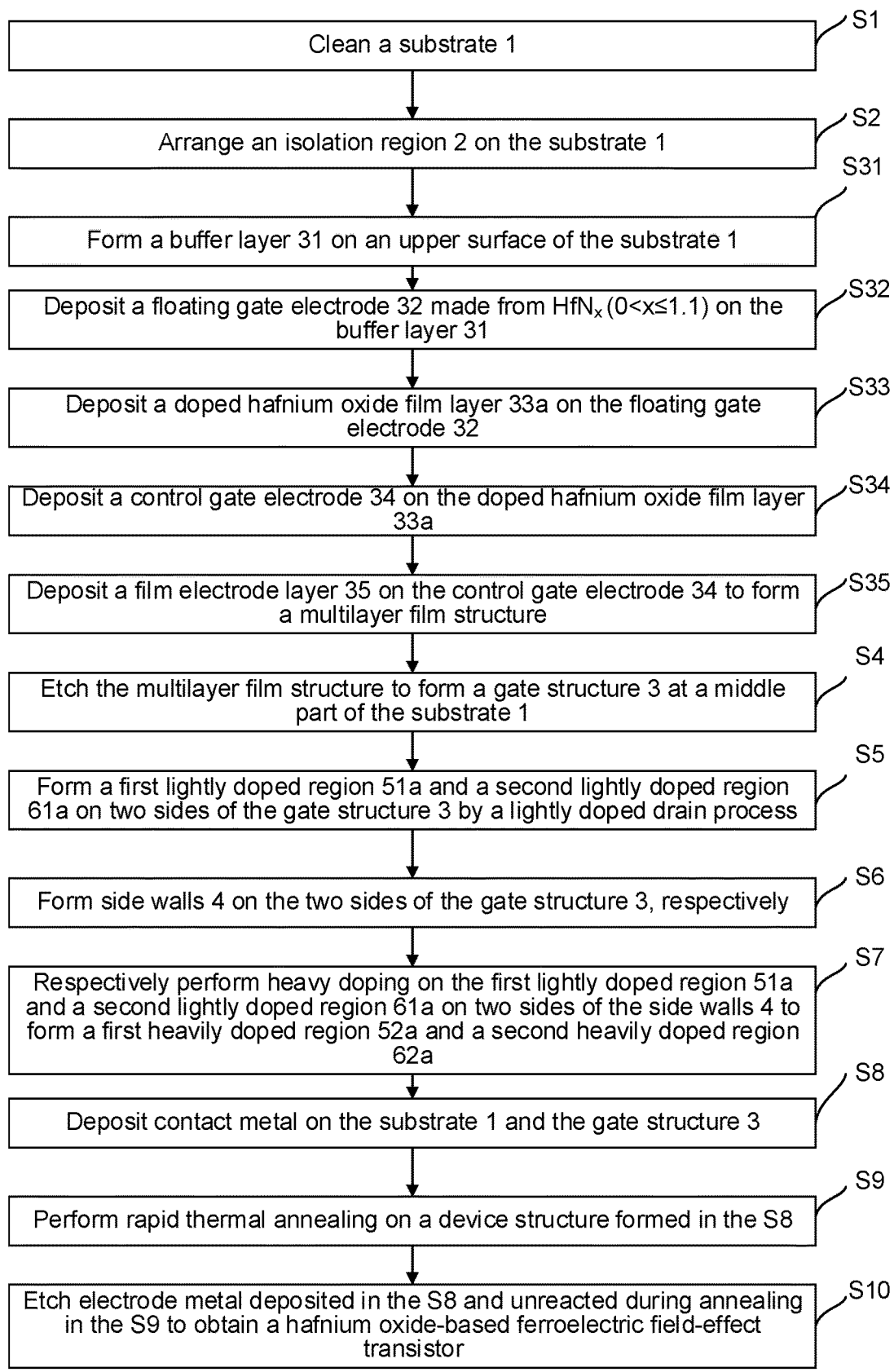
FIG. 2 is a flow chart of a manufacturing method of the hafnium oxide-based ferroelectric field effect transistor provided by an embodiment of the present disclosure.

FIG. 2 is a flow chart of a manufacturing method of a hafnium oxide-based ferroelectric field effect transistor provided by an embodiment of the present disclosure.

FIG. 3a to FIG. 3f are schematic diagrams of a manufacturing process of a hafnium oxide-based ferroelectric field effect transistor provided by an embodiment of the present disclosure.

Referring to FIG. 2 and FIG. 3, an embodiment of the present disclosure further provides a manufacturing method of a hafnium oxide-based ferroelectric field effect transistor, which includes the steps of:

S1, cleaning a substrate 1.

S2, arranging an isolation region 2 around the substrate 1, where an upper surface of the isolation region 2 is not lower than that of the substrate 1, and a bottom surface of the isolation region 2 is higher than that of the substrate 1.

S3, forming a multilayer film structure on the substrate 1, where the operation of forming the multilayer film structure in the S3 includes the following steps of:

S31, forming a buffer layer 31 on the upper surface of the substrate 1.

Optionally, the buffer layer 31 is formed by an atomic layer deposition process, a chemical vapor deposition process, a chemical oxidation process or a thermal oxidation process.

S32, forming a floating gate electrode 32 on the upper surface of the buffer layer 31, where the floating gate electrode 32 is made from $HfN_x$ which includes x N atoms, where $0 < x \leq 1.1$; and the floating gate electrode 32 has a thickness of 5 nm to 50 nm.

Optionally, the floating gate electrode 32 is formed by an atomic layer deposition process, a chemical vapor deposition process or a magnetron sputtering process.

S33, forming a doped hafnium oxide film layer 33a on the upper surface of the floating gate electrode 32, where elements doped in the doped hafnium oxide film layer 33a include at least one from the group consisting of zirconium (Zr), aluminum (Al), silicon (Si), yttrium (Y), strontium (Sr), lanthanum (La), lutetium (Lu), gadolinium (Gd), scandium (Sc), neodymium (Nd), germanium (Ge) and nitrogen (N).

Optionally, the doped hafnium oxide film layer 33a is formed by an atomic layer deposition process, a metal-organic chemical vapor deposition process or a magnetron sputtering process.

S34, forming a control gate electrode 34 on the upper surface of the doped hafnium oxide film layer 33a, where the control gate electrode 34 is made from $HfN_x$ which includes x N atoms, where $0 < x \leq 1.1$; and the control gate electrode 34 has a thickness of 5 nm to 50 nm.

Optionally, the control gate electrode 34 is formed by a magnetron sputtering process, a chemical vapor deposition process or an atomic layer deposition process.

S35, forming a film electrode layer 35 on the upper surface of the control gate electrode 34.

Optionally, the film electrode layer 35 is formed by a magnetron sputtering process or a chemical vapor deposition process.

S4, etching the multilayer film structure formed in the S3 to form a gate structure 3.

Optionally, the etching process is a reactive ion etching process.

S5, respectively forming a first lightly doped region 51a and a second lightly doped region 61a on the substrate 1 and on two sides of the gate structure 3 by adopting a lightly doped drain process.

Optionally, the lightly doped drain process in the S5 includes the following step of:

by taking the gate structure 3 formed in the S4 as a mask, respectively forming a first lightly doped region 51a and a second lightly doped region 61a on the two sides of the gate structure 3 by ion implantation.

S6, forming side walls 4 on the two sides of the gate structure 3, where inner surfaces of the side walls 4 are closely attached to the gate structure 3.

Specifically, the S6 includes the steps of: depositing an insulating dielectric layer on a device structure formed in the S5 by a chemical vapor deposition process, and etching the insulating dielectric layer by a reactive ion etching process to form the side walls 4.

Optionally, the insulating dielectric layer is made from at least one of $SiO_2$ and $Si_3N_4$.

S7, respectively forming a first heavily doped region 52a and a second heavily doped region 62a in the first lightly doped region 51a and the second lightly doped region 61a on the two sides of the side walls 4.

Optionally, the first heavily doped region 52a and the second heavily doped region 62a are respectively formed in the first lightly doped region 51a and the second lightly doped region 61a on the two sides of the side walls 4 by an iron implantation process.

S8, depositing electrode metal on a device structure formed in the S7.

Optionally, the electrode metal is deposited by a magnetron sputtering process or a chemical vapor deposition process.

Optionally, the electrode metal is any one of Ti, Co and Ni.

S9, performing rapid thermal annealing on a device structure formed in the S8 to activate ions implanted in the steps S5 and S7 to form a source region 5 and a drain region 6, forming a first metal silicide layer 71 on the source region 5 and the drain region 6, and forming a second metal silicide layer 72 on the upper surface of the gate structure 3.

The step of activating the ions implanted in the steps S5 and S7 to form the source region 5 and the drain region 6 includes:

S91, activating ions implanted in the first lightly doped region 51a and the first heavily doped region 52a to form an activated first lightly doped region 51b and an activated first heavily doped region 52b; and the activated first lightly doped region 51b and the activated first heavily doped region 52b form the source region 5.

S92, activating ions implanted in the second lightly doped region 61a and the second heavily doped region 62a to form an activated second lightly doped region 61b and an activated second heavily doped region 62b; and the activated second lightly doped region 61b and the activated second heavily doped region 62b form the drain region 6.

Sequences of step S91 and step S92 include but are not limited to the above sequences, can be synchronized, or can be appropriately adjusted according to actual needs.

Where, the rapid thermal annealing operation in the S9 further includes:

forming a ferroelectric phase in the doped hafnium oxide film layer to form a hafnium oxide-based ferroelectric film layer 33b.

Optionally, the rapid thermal annealing operation in the step S9 is performed at a temperature of 400° C. to 1000° C.

Optionally, the rapid thermal annealing operation in the step S9 is performed for 1-60 seconds.

Optionally, the rapid thermal annealing operation is performed in vacuum or in an inert gas.

Preferably, the inert gas is N2 or Ar.

Optionally, the first metal silicide layer 71 and the second metal silicide layer 72 are made from any one of $TiSi_2$, $CoSi_2$ and $NiSi_2$.

Optionally, each of the first metal silicide layer 71 and the second metal silicide layer 72 has a thickness of 5 nm to 30 nm.

S10, etching the electrode metal which is deposited in the S8 and unreacted during annealing in the S9 to obtain a hafnium oxide-based ferroelectric field effect transistor.

Optionally, the etching process is a wet etching process.

Figure 3A:
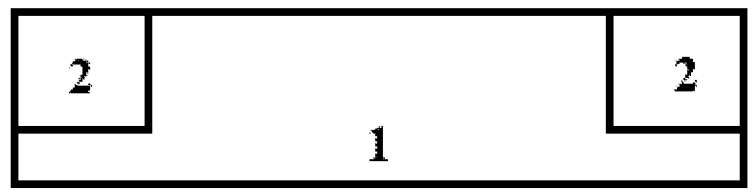
FIG. 3a to FIG. 3f are schematic diagrams of a manufacturing process of the hafnium oxide-based ferroelectric field effect transistor provided by an embodiment of the present disclosure.
Figure 3B:
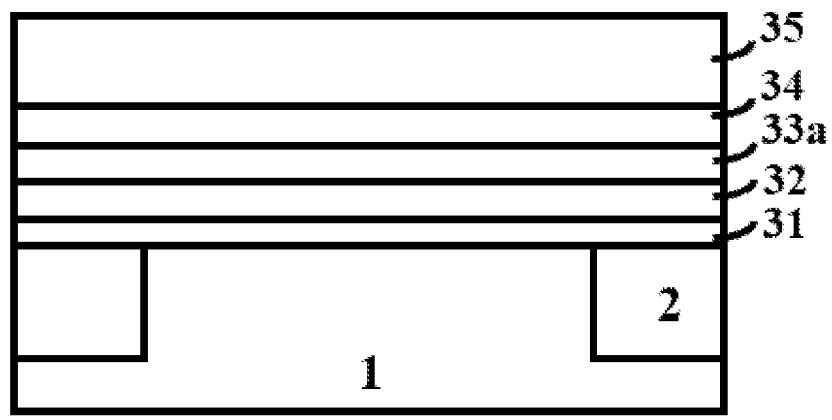
Figure 3C:
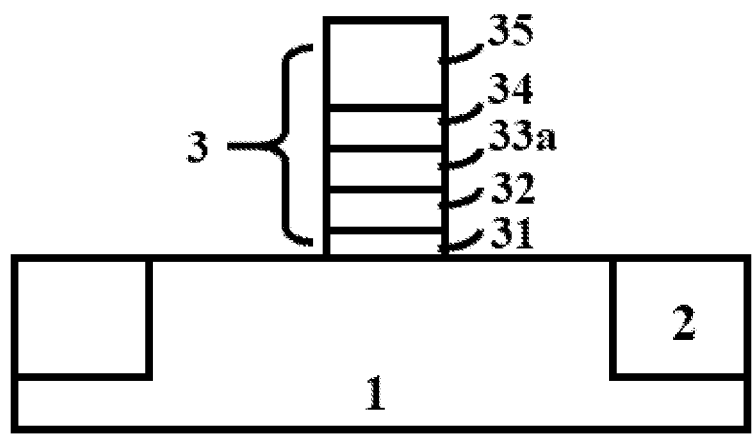
Figure 3D:
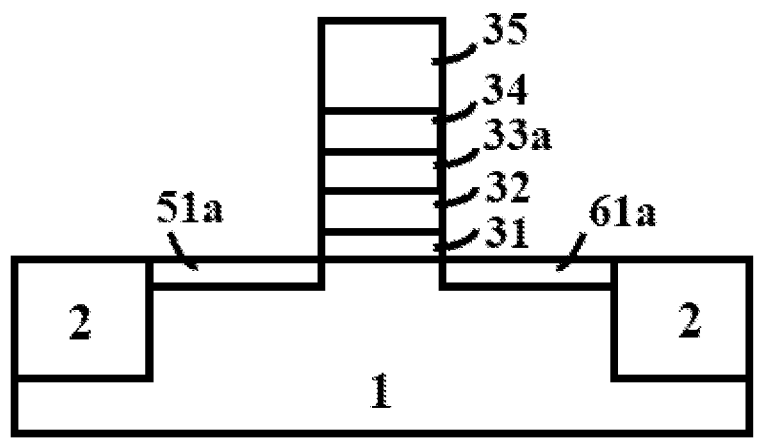
Figure 3E:
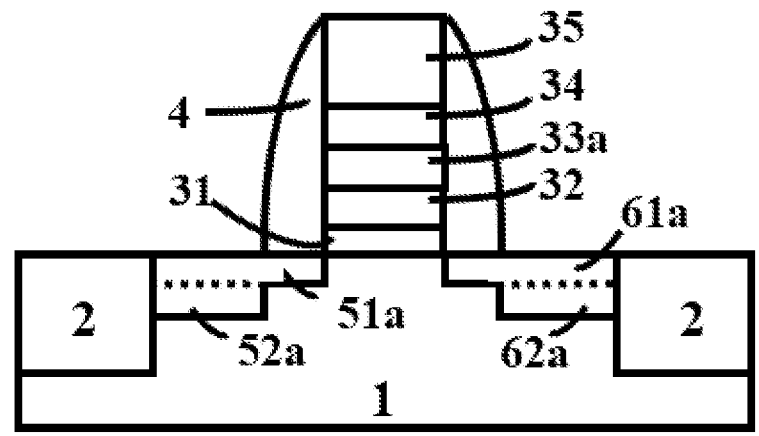
Figure 3F:
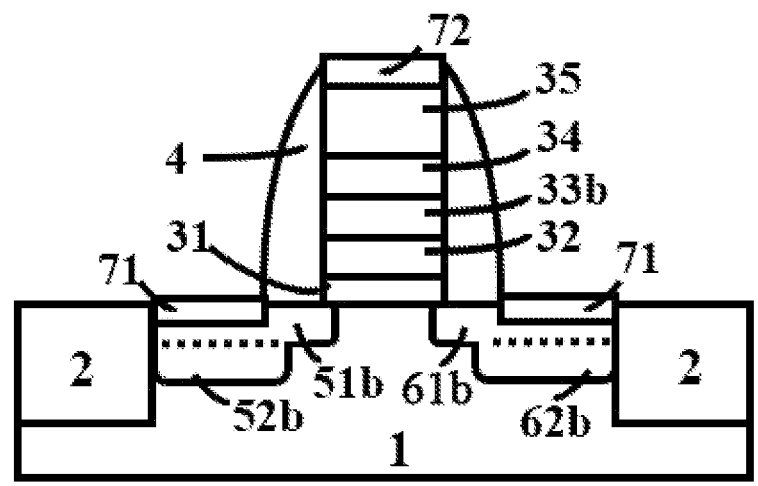

In the above embodiments, the positions of the first lightly doped region 51a and the second lightly doped region 61a shown in FIG. 3d and FIG. 3e are merely examples and are not intended to limit the present disclosure; the positions of the first lightly doped region 51a and the second lightly doped region 61a can be exchanged; and correspondingly, the positions of the first heavily doped region 52a and the second lightly doped region 62a in FIG. 3e, the positions of the activated first lightly doped region 51b and the activated second lightly doped region 61b in FIG. 3f, and the positions of the activated first heavily doped region 52b and the activated second heavily doped region 62b are adjusted correspondingly.

A manufacturing method of the hafnium oxide-based ferroelectric field effect transistor of the present disclosure will be described below in conjunction with specific embodiments.

EMBODIMENT 1

Referring to FIG. 2 and FIG. 3a to FIG. 3f, Embodiment 1 provides a manufacturing method of a hafnium oxide-based ferroelectric field effect transistor, where the selected substrate 1 is p-type doped Si (p-Si), and the manufacturing method includes the following steps:

Step 1, referring to FIG. 2 and FIG. 3a, firstly, the substrate 1 is cleaned by a standard cleaning process according to a process flow S1. Subsequently, an isolation region 2 is formed by a local oxidation of silicon (LOCOS) process according to a process flow S2, and a region outside the isolation region 2 is defined as an active region.

Step 2, referring to FIG. 2 and FIG. 3b, firstly, the substrate 1 is cleaned again by the standard cleaning process to remove an oxide layer from a surface of the active region; and a buffer layer 31 made from $HfO_2$ and with a thickness of 5 nm is deposited by an atomic layer deposition process according to a process flow S31.

Step 3, referring to FIG. 2 and FIG. 3b, HfN with a thickness of 10 nm is formed as a floating gate electrode 32 on the buffer layer 31 formed in the step 2 by a magnetron sputtering process according to a process flow S32.

Step 4, referring to FIG. 2 and FIG. 3b, a doped hafnium oxide film layer 33a made from $Hf_{0.5}Zr_{0.5}O_2$ and with a thickness of 10 nm is deposited on the floating gate electrode 32 formed in step 3 by an atomic layer deposition process according to a process flow S33.

Step 5, referring to FIG. 2 and FIG. 3b, HfN with a thickness of 10 nm is deposited as a control gate electrode 34 on the doped hafnium oxide film layer 33a by a magnetron sputtering process according to a process flow S34.

Step 6, referring to FIG. 2 and FIG. 3b, a film electrode layer 35 made from polysilicon and with a thickness of 50 nm is deposited on the HfN control gate electrode 34 formed in the step 5 by a chemical vapor deposition process according to a process flow S35.

Step 7, referring to FIG. 2 and FIG. 3c, a multilayer film structure formed from the step 2 to the step 6 are etched by a reactive ion etching process according to a process flow S4 to form a gate structure 3.

Step 8, referring to FIG. 2 and FIG. 3d, by taking the gate structure 3 formed in the step 7 as a mask, a first lightly doped region 51a and a second lightly doped region 61a are respectively formed by implanting As ions to the substrate 1 from two sides of the gate structure 3 by an ion implantation process according to a lightly doped drain process (LDD) in a process flow S5.

In the Embodiment 1, the substrate 1 is made from p-type doped Si (p-Si), and the first lightly doped region 51a and the second lightly doped region 61a at this position are low-energy shallow junction lightly doped n regions (n−).

Step 9, referring to FIG. 2 and FIG. 3e, firstly, a silicon dioxide layer with a thickness of 100 nm is deposited by a chemical vapor deposition process according to a process flow S6 to cover the gate structure 3 and the substrate 1; subsequently, the silicon dioxide layer is etched away by a dry etching process; and due to anisotropy, a part of silicon dioxide is retained on two sides of the gate structure 3 to form side walls 4.

Step 10, referring to FIG. 2 and FIG. 3f, phosphorus ions are implanted into the substrate 1 from the two sides of the side walls 4 by an ion implantation process according to a process flow S7 after the side walls 4 are formed, so as to respectively form a first heavily doped region 52a and a second heavily doped region 62a in the first lightly doped region 51a and the second lightly doped region 61a on the two sides of the side walls 4.

In the Embodiment 1, the substrate 1 is made from p-type doped Si (p-Si), and the first heavily doped region 52a and the second heavily doped region 62a at this position are n-type heavily doped regions (n+).

Step 11, referring to FIG. 2 and FIG. 3f, electrode metal Ti with a thickness of 50 nm is deposited by a magnetron sputtering process according to a process flow S8 to cover the gate structure 3 and the substrate 1.

Step 12, referring to FIG. 2 and FIG. 3f, a device structure formed in the step 11 is subjected to rapid thermal annealing (RTA) at 500° C. for about 60 seconds in an N2 atmosphere according to a process flow S9.

Specifically, the step of rapid thermal annealing includes:
1. The ions implanted in the first lightly doped region 51a and the first heavily doped region 52a are activated to form an activated first lightly doped region 51b and an activated first heavily doped region 52b; and the activated first lightly doped region 51b and the activated first heavily doped region 52b form the source region 5.
2. The ions implanted in the second lightly doped region 61a and the second heavily doped region 62a are activated to form an activated second lightly doped region 61b and an activated second heavily doped region 62b; and the activated second lightly doped region 61b and the activated second heavily doped region 62b form the drain region 6.
3. The doped hafnium oxide film layer 33a is crystallized to form a hafnium oxide-based ferroelectric film 33b.
4. A first metal silicide layer 71 is formed on the source region 5 and the drain region 6, and a second metal silicide layer 72 is formed on the upper surface of the gate structure 3.

Step 13, referring to FIG. 2 and FIG. 3F, the electrode metal deposited in the step 11 and unreacted during annealing in the step 12 is etched away by a wet etching process according to a process flow S10 to obtain a hafnium oxide-based ferroelectric field effect transistor.

EMBODIMENT 2

Referring to FIG. 2 and FIG. 3a to FIG. 3f, Embodiment 2 provides a manufacturing method of a hafnium oxide-based ferroelectric field effect transistor, where the selected substrate 1 is p-type SOI base plate, and the manufacturing method includes the following steps:

Step 1, referring to FIG. 2 and FIG. 3a, firstly, the substrate 1 is cleaned by a standard cleaning process according to a process flow S1. Subsequently, a silicon substrate at the isolation region 2 is etched by a reactive ion etching process according to a process flow S2 to form a Mesa structure on the substrate 1 to realize isolation, and a region outside the isolation region 2 is defined as an active region.

Step 2, referring to FIG. 2 and FIG. 3b, firstly, the substrate 1 is cleaned again by the standard cleaning process to remove an oxide layer from a surface of the active region; and a buffer layer 31 made from $Al_2O_3$ and with a thickness of 5 nm is deposited by a chemical vapor deposition process according to a process flow S31.

Step 3, referring to FIG. 2 and FIG. 3b, $HfN_{0.5}$ with a thickness of 20 nm is formed as a floating gate electrode 32 on the buffer layer 31 formed in the step 2 by a chemical vapor deposition process according to a process flow S32.

Step 4, referring to FIG. 2 and FIG. 3b, a doped hafnium oxide film layer 33a with a thickness of 15 nm is deposited on the floating gate electrode 32 formed in the step 3 by an atomic layer deposition process according to a process flow S33, where the doped hafnium oxide film layer 33a is made from aluminum-doped hafnium oxide ($Al:HfO_2$), with a doping content of 4.8%.

Step 5, referring to FIG. 2 and FIG. 3b, $HfN_{0.5}$ with a thickness of 5 nm is deposited as a control gate electrode 34 on the doped hafnium oxide film layer 33a by a chemical vapor deposition process according to a process flow S34.

Step 6, referring to FIG. 2 and FIG. 3b, a film electrode layer 35 made from W and with a thickness of 50 nm is deposited on the $HfN_{0.5}$ control gate electrode 34 formed in the step 5 by a magnetron sputtering process according to a process flow S35.

Step 7, referring to FIG. 2 and FIG. 3c, a multilayer film structure formed from the step 2 to the step 6 are etched by a reactive ion etching process according to a process flow S4 to form a gate structure 3.

Step 8, referring to FIG. 2 and FIG. 3d, by taking the gate structure 3 formed in the step 7 as a mask, As ions are implanted into the substrate 1 from the two sides of the gate structure 3 to respectively form a first lightly doped region 51a and a second lightly doped region 61a by an ion implantation process according to a lightly doped drain process (LDD) in a process flow S5.

In the Embodiment 2, the substrate 1 is made from p-type doped Si (p-Si), and the first lightly doped region 51a and the second lightly doped region 61a at this position are low-energy shallow junction lightly doped n regions (n−) 51a.

Step 9, referring to FIG. 2 and FIG. 3e, firstly, a silicon dioxide layer with a thickness of 120 nm is deposited by a chemical vapor deposition process according to a process flow S6 to cover the gate structure 3 and the substrate 1; subsequently, the silicon dioxide layer is etched away by a dry etching process; and due to anisotropy, a part of silicon dioxide retained on two sides of the gate structure 3 to form side walls 4.

Step 10, referring to FIG. 2 and FIG. 3f, phosphorus ions are implanted into the substrate 1 from the two sides of the side walls 4 by an ion implantation process according to a process flow S7 after the side walls 4 are formed, so as to respectively form a first heavily doped region 52a and a second heavily doped region 62a in the first lightly doped region 51a and the second lightly doped region 61a on the two sides of the side walls 4.

In the Embodiment 2, the substrate 1 is made from p-type doped Si (p-Si), and the first heavily doped region 52a and the second heavily doped region 62a at this position are n-type heavily doped regions (n+).

Step 11, referring to FIG. 2 and FIG. 3f, electrode metal Ni with a thickness of 80 nm is deposited by a magnetron sputtering process according to a process flow S8 to cover the gate structure 3 and the substrate 1.

Step 12, referring to FIG. 2 and FIG. 3f, a structure formed from the step 1 to the step 11 is subjected to rapid thermal annealing (RTA) at 700° C. for about 30 seconds in an $N_2$ atmosphere according to a process flow S9. In this step, formation principles and processes of the hafnium oxide-based ferroelectric film 33b, the source region 5, the drain region 6, the first metal silicide layer 71 and the second metal silicide layer 72 are the same as that in Embodiment 1, which are not repeated here.

Step 13, referring to FIG. 2 and FIG. 3F, the electrode metal deposited in the step 11 and unreacted during annealing in the step 12 is etched away by a wet etching process according to a process flow S10 to obtain a hafnium oxide-based ferroelectric field effect transistor.

EMBODIMENT 3

Referring to FIG. 2 and FIG. 3a to FIG. 3f, Embodiment 3 provides a manufacturing method of a hafnium oxide-based ferroelectric field effect transistor, where the selected substrate 1 is n-type doped Si (n-Si), and the manufacturing method includes the following steps:

Step 1, referring to FIG. 2 and FIG. 3a, firstly, the substrate 1 is cleaned by a standard cleaning process according to a process flow S1. Subsequently, an isolation region 2 is formed on the substrate 1 by a shallow trench isolation (STI) process according to a process flow S2, and a region outside the isolation region 2 is defined as an active region.

Step 2, referring to FIG. 2 and FIG. 3b, firstly, the substrate 1 is cleaned again by the standard cleaning process to remove an oxide layer from a surface of the active region; $SiO_2$ with a thickness of 0.7 nm grows on the substrate 1 by a chemical oxidization process according to a process flow S31; $La_2O_3$ with a thickness of 3 nm is deposited by an atomic layer deposition process; and the grown $SiO_2$ and $La_2O_3$ are together used as a buffer layer 31.

Step 3, referring to FIG. 2 and FIG. 3b, HfN0.8 with a thickness of 15 nm is formed as a floating gate electrode 32 on the buffer layer 31 formed in the step 2 by a magnetron sputtering process according to a process flow S32.

Step 4, referring to FIG. 2 and FIG. 3b, a doped hafnium oxide film layer 33a with a thickness of 8 nm is deposited on the floating gate electrode 32 formed in the step 3 by a magnetron sputtering process according to a process flow S33, where the doped hafnium oxide film layer 33a is made from Si-doped hafnium oxide ($Si:HfO_2$), with a doping content of 4%.

Step 5, referring to FIG. 2 and FIG. 3b, $HfN_{1.1}$ with a thickness of 5 nm is deposited as a control gate electrode 34 on the doped hafnium oxide film layer 33a by a magnetron sputtering process according to a process flow S34.

Step 6, referring to FIG. 2 and FIG. 3b, a film electrode layer 35 made from TiN and with a thickness of 80 nm is deposited on the $HfN_{1.1}$ control gate electrode 34 formed in the step 5 by a chemical vapor deposition process according to a process flow S35.

Step 7, referring to FIG. 2 and FIG. 3c, a multilayer film structure formed from the step 2 to the step 6 are etched by a reactive ion etching process according to a process flow S4 to form a gate structure 3.

Step 8, referring to FIG. 2 and FIG. 3d, by taking the gate structure 3 formed in the step 7 as a mask, B ions are implanted into the substrate 1 from the two sides of the gate structure 3 to respectively form a first lightly doped region 51a and a second lightly doped region 61a by an ion implantation process according to a lightly doped drain process (LDD) in a process flow S5.

In the Embodiment 3, the substrate 1 is made from n-type doped Si (n-Si), and the first lightly doped region 51a and the second lightly doped region 61a at this position are low-energy shallow junction lightly doped p regions (p−).

Step 9, referring to FIG. 2 and FIG. 3e, firstly, a silicon dioxide layer with a thickness of 150 nm is deposited by a chemical vapor deposition process according to a process flow S6 to cover the gate structure 3 and the substrate 1; subsequently, the silicon dioxide layer is etched away by a dry etching process; and due to anisotropy, a part of silicon dioxide retained on two sides of the gate structure 3 to form side walls 4.

Step 10, referring to FIG. 2 and FIG. 3f, B ions are implanted into the substrate 1 from the two sides of the side walls 4 by an ion implantation process according to a process flow S7 after the side walls 4 are formed, so as to respectively form a first heavily doped region 52a and a second heavily doped region 62a in the first lightly doped region 51a and the second lightly doped region 61a on the two sides of the side walls 4.

In the Embodiment 3, the substrate 1 is made from n-type doped Si (n-Si), and the first heavily doped region 52a and the second heavily doped region 62a at this position are n-type heavily doped regions (p+).

Step 11, referring to FIG. 2 and FIG. 3f, electrode metal Co with a thickness of 100 nm is deposited by a magnetron sputtering process according to a process flow S8 to cover the gate structure 3 and the substrate 1.

Step 12, referring to FIG. 2 and FIG. 3f, a device structure formed in the step 11 is subjected to rapid thermal annealing (RTA) at 1000° C. for about 1 second in an Ar atmosphere according to a process flow S9. In this step, formation principles and processes of the hafnium oxide-based ferroelectric film layer 33b, the source region 5, the drain region 6, the first metal silicide layer 71 and the second metal silicide layer 72 are the same as that in Embodiment 1, which are not repeated here.

Step 13, referring to FIG. 2 and FIG. 3F, the electrode metal deposited in the step 11 and unreacted during annealing in the step 12 is etched away by a wet etching process according to a process flow S10 to obtain a hafnium oxide-based ferroelectric field effect transistor.

By adopting the hafnium oxide-based ferroelectric film, the manufacturing method of the hafnium oxide-based ferroelectric field effect transistor in this embodiment enables the manufactured hafnium oxide-based ferroelectric field effect transistor to have a better scalability, can improve a memory density of a memory, and solves the technical problems that an ferroelectric field effect transistor in the prior art is poor in scalability and limits an equal-proportion reduction process of devices. The $HfN_x$ ($0<x\le1.1$) with an excellent thermal stability is used for manufacturing the floating gate electrode and the control gate electrode; as an Hf series metal, the $HfN_x$ ($0<x\le1.1$) commendably avoids an interface reaction between the floating gate electrode and the control gate electrode and the hafnium oxide-based ferroelectric film in a crystallization annealing process in the prior art, avoids element diffusion, and improves electrical reliability of the ferroelectric field effect transistor. In addition, the $HfN_x$ can be simply etched, which is beneficial to integration of devices, and solves integration process problems caused by using Pt electrodes as the floating gate electrode and the control gate electrode in the prior art.

The present disclosure aims to protect a hafnium oxide-based ferroelectric field effect transistor and a manufacturing method thereof, which have the following technical effects:

1. The $HfN_x$ ($0<x\le1.1$) with an excellent thermal stability is used for manufacturing the floating gate electrode and the control gate electrode; and as an Hf series metal, the $HfN_x$ ($0<x\le1.1$) commendably avoids an interface reaction between the floating gate electrode and the control gate electrode and the hafnium oxide-based ferroelectric film in a crystallization annealing process in the prior art, avoids element diffusion, and improves electrical reliability of the hafnium oxide-based ferroelectric field effect transistor.

2. The manufacturing method of a hafnium oxide-based ferroelectric field effect transistor provided by the present disclosure adopts a gate-first process, which can achieve a high integration density; moreover, a self-alignment process is introduced, that is, a gate structure formed after etching is used as a mask, and lightly doped regions are formed on two sides of the gate structure by an ion implantation process, which can lower the process difficulty.

3. By adopting an RTA technology, operations of the process are simplified; on the one hand, implanted ions are activated to form the source region and the drain region of the hafnium oxide-based ferroelectric field effect transistor; on the other hand, the doped hafnium oxide film layer is crystallized to form a ferroelectric phase, i. e., a hafnium oxide-based ferroelectric film is formed; and metal silicide layers can also be formed on the source region, the drain region and the gate structure to lower a contact resistance.

It should be understood that the above specific embodiments of the present disclosure are merely used to illustrate or explain the principles of the present disclosure, and do not limit the present disclosure. Therefore, any modifications and equivalent substitutions, improvements and the like made without departing from the spirit and scope of the present disclosure should be included in the protection scope of the present disclosure. In addition, the appended claims of the present disclosure are intended to cover all changes and modifications that fall within the scope and boundaries, or equivalents of such scope and boundaries of the appended claims.

What is claimed is:

1. A hafnium oxide-based ferroelectric field effect transistor, comprising:
    a substrate (1);
    an isolation region (2) arranged around the substrate (1), wherein an upper surface of the isolation region (2) is not lower than that of the substrate (1), and a bottom surface of the isolation region (2) is not lower than that of the substrate (1);
    a gate structure (3) including a buffer layer (31), a floating gate electrode (32), a hafnium oxide-based ferroelectric film layer (33b), a control gate electrode (34) and a film electrode layer (35) which are sequentially stacked from bottom to top at a middle part of the upper surface of the substrate (1);
    a side wall (4) arranged outside the gate structure (3), wherein an inner surface of the side wall (4) is closely attached to the gate structure (3);
    a source region (5) and a drain region (6) which are oppositely arranged on two sides of the gate structure (3) and are formed by extending from an inner side of the isolation region (2) to the middle part of the substrate (1), wherein upper surfaces of the source region (5) and the drain region (6) are flush with that of the substrate (1), and bottom surfaces of the region (5) and the drain region (6) are not lower than that of the isolation region (2);
    a first metal silicide layer (71) formed by extending from the inner side of the isolation region (2) to the side wall (4), wherein an upper surface of the first metal silicide layer (71) is higher than that of the substrate (1); a bottom surface of the first metal silicide layer (71) is higher than that of the isolation region (2); and the first metal silicide layer (71) is shorter than the source region (5) or the drain region (6); and
    a second metal silicide layer (72) arranged on an upper surface of the gate structure (3), wherein a lower surface of the second metal silicide layer (72) is closely attached to the gate structure (3); and
    wherein the floating gate electrode (32) and the control gate electrode (34) are made from $HfN_x$, wherein $0<x\le1.1$;
    each of the floating gate electrode (32) and the control gate electrode (34) has a thickness of 5 nm to 50 nm;
    the hafnium oxide-based ferroelectric film layer (33b) has a thickness of 3 nm to 20 nm; and
    wherein the floating gate electrode (32), the hafnium oxide-based ferroelectric film layer (33b), and the control gate electrode (34) jointly form a hafnium-based stack and the hafnium-based stack includes a 3-20 nm thick hafnium oxide-based layer interposed between two 5-50 nm thick $HfN_x$ layers.

2. The hafnium oxide-based ferroelectric field effect transistor according to claim 1, wherein
    the buffer layer (31) is made from any one or more of $SiO_2$, SiON, $Al_2O_3$, $La_2O_3$, $HfO_2$, HfON, HfSiON, and aluminum-doped $HfO_2$(Al:$HfO_2$), and
    the buffer layer (31) has a thickness of 3 nm to 10 nm.

3. The hafnium oxide-based ferroelectric field effect transistor according to claim 1, wherein
    the film electrode layer (35) is made from any one or more of polysilicon, amorphous silicon, W, TaN, TiN and $HfN_x$ ($0<x\le1.1$), and the film electrode layer (35) has a thickness of 10 nm to 200 nm.

4. The hafnium oxide-based ferroelectric field effect transistor according to claim 1, wherein
    the first metal silicide layer (71) and the second metal silicide layer (72) are made from any one of $TiSi_2$, $CoSi_2$ and $NiSi_2$, and the first metal silicide layer (71) and the second metal silicide layer (72) both have a thickness of 5 nm to 30 nm.

5. The hafnium oxide-based ferroelectric field effect transistor according to claim 1, wherein
at least one element from a group consisting of zirconium (Zr), aluminum (Al), silicon (Si), yttrium (Y), strontium (Sr), lanthanum (La), lutetium (Lu), gadolinium (Gd), scandium (Sc), neodymium (Nd), germanium (Ge) and nitrogen (N) is doped in the hafnium oxide-based ferroelectric film layer (33*b*).

* * * * *